United States Patent [19]

Bloy

[11] 4,400,583
[45] Aug. 23, 1983

[54] COMPLETE AUDIO PROCESSING SYSTEM

[75] Inventor: Graham P. Bloy, Bangkok, Thailand

[73] Assignee: Metme Communications, St. Louis, Mo.

[21] Appl. No.: 282,051

[22] Filed: Jul. 10, 1981

Related U.S. Application Data

[63] Continuation-in-part of Ser. No. 59,394, Jul. 20, 1979, abandoned.

[51] Int. Cl.$^3$ ............................................. H04B 1/64
[52] U.S. Cl. ................................ 179/1 D; 179/1 VL
[58] Field of Search .................. 179/1 B, 1 D, 1 VL, 179/1 M, 15.55, 1 F, 15.55 R; 333/14, 28 T

[56] References Cited

U.S. PATENT DOCUMENTS

| | | | |
|---|---|---|---|
| 2,269,011 | 1/1942 | Dallos | 179/1 D |
| 2,341,336 | 2/1944 | Singer | 333/28 T |
| 3,539,725 | 11/1970 | Hellwarth et al. | 179/1 D |
| 3,775,705 | 11/1973 | Dolby | 333/14 |
| 3,949,325 | 4/1976 | Berkovitz | 179/1 D |
| 4,025,723 | 5/1977 | Blackledge | 179/1 VL |
| 4,114,115 | 9/1978 | Minnis | 333/14 |
| 4,118,601 | 10/1978 | Yeap | 179/1 D |
| 4,190,806 | 2/1980 | Wermuth | 333/14 |
| 4,249,042 | 2/1981 | Orban | 179/1 VL |

OTHER PUBLICATIONS

H. Tremaine; *Audio Cyclopedia*; 1977; p. 938.

Primary Examiner—G. Z. Rubinson
Assistant Examiner—Randall P. Myers
Attorney, Agent, or Firm—Kalish & Gilster

[57] ABSTRACT

A complete audio processing system of solid state design for providing improvement of audible signals through dynamic compression including an active filter for transient suppression, a gain control, and a plurality of active frequency control stages for selectively controlling internal gain of signals in different frequency bands. Outputs of the frequency control stages are mixed and provided to a compressor stage having an operational amplifier of gain fixed by a DC feedback network. A gain cell provides variable negative feedback. A rectifier circuit measures the average value of the audio input to the compressor stage and controls the gain cell as a function of the average value to provide negative feedback which increases as a function of increase in the level of said input signal. An attenuator receives the output of the operational amplifier and provides an attenuated but dynamically compressed output so that the circuit provides no substantial overall gain but achieves high compression. Optimum achievable compression is indicated by an LED indicator lamp.

15 Claims, 2 Drawing Figures

COMPLETE AUDIO PROCESSING SYSTEM

CROSS REFERENCE TO RELATED APPLICATION

This is a continuation-in-part of application Ser. No. 59,394, filed July 20, 1979, now abandoned.

BACKGROUND AND SUMMARY OF THE INVENTION

The present invention relates to apparatus for audio signal processing and, more particularly, to an extremely simple, low cost complete audio processing system utilizable as a compressor.

Many electronic circuits of a complex electronic nature have been developed over the years for processing of audio signals. But owing to their complexity, large size, and sophistication of such circuitry, their use has been primarily limited to studios, the recording industry, radio stations, and in other applications where such attributes pose no problem. Such circuits previously have been used, for example, to modify the sound of musical instruments or human voices when making recordings, as in the record industry. But such prior art circuitry has not been effectively utilizable by ordinary citizens because of high cost, large size, and complexity (typically thousands of dollars for sutido or commercial units) even though it can provide useful modification of audio signals, such as voice or music. There has not existed heretofore small, compact, low cost circuitry for providing dynamic clarification capable of enhancing the quality of audio signals as by ordinary amplification of such signals.

It is an object of the present invention to provide simple, low cost, effective circuitry for providing improvement of audible signals by enhancing clarity and selectively modifying tonal quality.

A further object of the invention is the provision of such circuitry which utilizes dynamic compression and selective enhancement of frequency bands for such purposes.

Another object of the invention is the provision of such circuitry which is low powered, has relatively few components and can be battery operated.

A further object of the invention is the provision of such circuitry which is sufficiently compact as to be housed within an enclosure sufficiently small, compact and lightweight to be carried by hand or in the pocket and to include a small, long-life battery power supply.

Yet another object of the invention is the provision of such circuitry which provides transient filtering, tonal enhancement and signal compression in a most versatile nature, which has simple and effective controls; and which achieves modification and enhancement of audible signals to an extent favorably comparable to expensive studio and commercial electronic equipment.

Other objects of the invention include provision of such circuitry which can be easily expanded in function by duplication for stereophonic or quadriphonic use; which can be readily expanded and adapted to provide selective control over tonal characteristics of signals in numerous frequency bands; and which is compatible with conventional types of audio equipment, such as standard amplifiers, microphones, instrument pick-ups and other conventional audible sound sources.

Among still other objects of the invention may be noted the provision of such circuitry which, when utilized with musical instruments, improves the sound of such instruments including even low quality instruments having otherwise poor tone; which enhances versatility of such instruments by providing selective variation of audible signals produced by the instrument which otherwise would not be available; which is useful with electric guitars or the like for providing tonal clarity which allows a musician to more effectively hear the full effect of his playing the instrument.

Numerous other objects will be in part apparent and in part pointed out hereinbelow.

DESCRIPTION OF THE PREFERRED EMBODIMENT

The single FIGURE illustrates the preferred circuit configuraton of an active audio tone network of an entirely solid state character which is intended primarily for use with other audio equipment, such as electrical musical instruments (e.g., electric guitars), various audio signal sources (including both music or voice), and audio amplifiers (including public address systems). The new circuit, when so used with other equipment, is capable of providing improvement of audible signals by enhancing clarity and by selectively modifying tonal quality in desired ways, as developed more fully hereinbelow.

The new network is suitable for being battery operated and for being housed in a small, compact enclosure of the type used heretofore as small instrument cases and capable of being carried by hand or in the pocket. As such enclosures are well known, no need exists for describing the same, it being sufficient to observe that the present invention, in sharp contrast with prior art circuits used by broadcasting studios for achieving similar improvements or modification of audible signals, occupies extremely small space and may be fully portable, being typically and preferably housed in an enclosure of about 13 cm.×5 cm.

Accordingly, the invention provides a circuit which, when so housed, provides a small, portable device which is advantageously used by musicians, performers, and others confronted with problems of objectionable tonal response, distortion, and lack of clarity in sound sources such as musical instruments which are used with amplifiers as during performances in domestic usage. The device is utilized quite efficiently also with home music systems such as those including monaural (including movie projectors), stereophonic, or quadriphonic amplifiers and speakers. Although FIG. 1 illustrates circuitry for use with one audio channel, it is manifest that the circuit can, by simply being used in duplicate configuration, be used for multi-channel purposes, as in stereo systems or even in studios.

The multitudinous functions of the new circuit are best appreciated by identification and consideration of its various principle stages.

Figure 1:
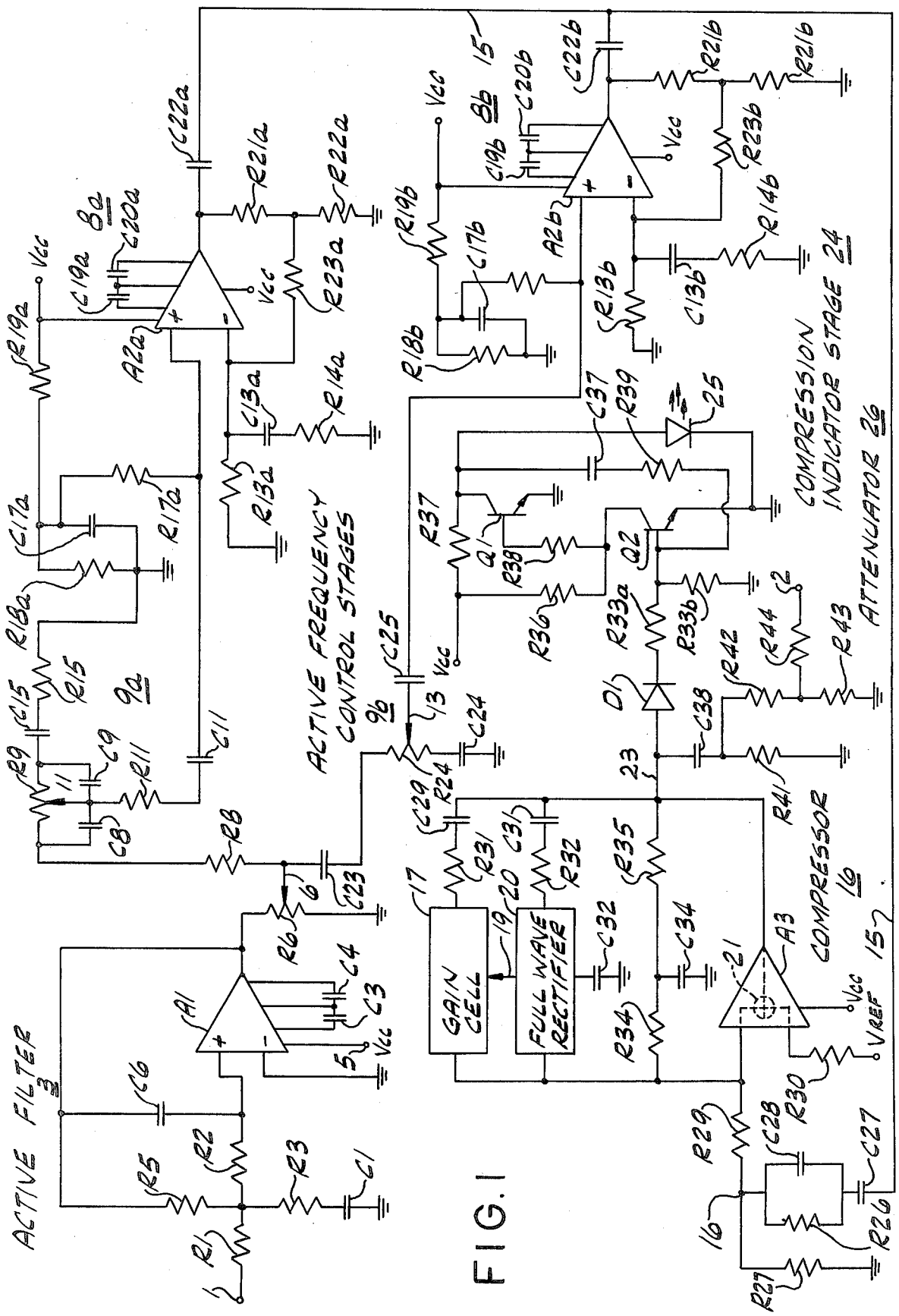
FIG. 1 is a schematic circuit diagram of a complete audio processing system constructed in accordance with and embodying the present invention.

Referring to FIG. 1, illustrated at 1 and 2 are, respectively, the input and output of the circuit. Input 1 receives an audio signal to be modified and provided by output 2. Thus, the circuit receives one audio channel.

Both the input and output may comprise conventional circuit jacks of the shielded type, being the only connections to the circuit, potentials for operation of the circuit being preferably supplied by batteries within the preferred enclosure.

Signals provided to input 1 may be of quite low level, such as the output of a microphone or the pick-up of a guitar or other musical instrument, the output of a phonograph cartridge, tape recorder, tuner, etc. Such signals are provided from input 1 to an active filter stage 3 by an impedance matching network comprising resistors R1, R2, R3 and a capacitor C1 and thence to the noninverting input of a differential operational amplifier A1 having its inverting input grounded. Usual compensating capacitors such as those designated C3, C4 may be utilized as is known to those skilled in the use of commercially available operational amplifiers, and operating voltage $V_{cc}$ of suitable level is provided by a terminal 5. A feedback circuit including a capacitor C6 and resistor R5 provide decoupling and suitable AC feedback.

Hence, the active filter stage 3 provides the input signal, but filtered at the output of operational amplifier A1, the latter providing the filtered signal across a potentiometer R6. The wiper 6 of the latter is selectively controllable by the user to effectively provide a compression level adjustment and gain control of the circuit.

As preferably configured, active filter stage 3 does not provide gain, within a tolerance of ±1 db., but does correct and suppress transients which may be produced by bad connections at the input or by faulty patch cords, as well as other unwanted transient noise. A later-described compressor stage of the circuit could also be caused to malfunction or provide audibly disturbing constituents at output 2 if such transients were not suppressed by active filter stage 3.

Active frequency control stages 8a, 8b are provided and, since these stages have several corresponding components which are connected in identical manner and have the same component values, corresponding elements are similarly designated by utilizing a common reference numeral followed by the subscript "a" or "b" as appropriate.

Additionally forming parts of frequency control stage 8a, 8b, however, are respective resistive-capacitive passive networks 9a, 9b. Network 9a includes a resistor R8 interconnecting a potentiometer R9 with wiper 6. Wiper 11 is selectively controllable by the user so that potentiometer R9 serves as a high frequency gain control.

Connected from opposite sides of potentiometer R9 to its wiper 11 are capacitors C8, C9. The signal present in wiper 11 is provided through a resistor R11 and capacitor C11 to the noninverting input of an operational amplifier A2a having its inverting input referenced to ground by a circuit including a resistor R13a which is shunted by a series-connected capacitor C13a and resistor R14a.

The opposite end of potentiometer is connected through a capacitor C15 and resistor R15 to the circuit ground. It may be noted also that interconnected with the noninverting input of operational amplifier A2a is a frequency compensating circuit comprising resistors R17a and R18a, capacitor C17a connected thereacross and one end being connected to circuit ground. A resistor R19a references the node between resistors R17a and R18a to the power supply potential $V_{cc}$ for offset error compensation.

Negative feedback for the operational amplifier is established by a voltage divider including resistors R21a, R22a and a further resistor R23a interconnecting the node between these two resistors and the inverting input compensating capacitors C19a, C20a also are conventionally connected to the operational amplifier.

As thus configured, circuit stages 8a and 9a together constitute an active high frequency control circuit providing gain control over frequencies determined by the setting of potentiometer wiper 11 and with gain being preferably up to about 18 db. within the range of from preferably about 3.5–30 KHz. The output of this high frequency control circuitry is provided through a capacitor C22a to a lead 15 for being mixed with lower frequency signals provided by operational amplifier A2b in the low frequency amplification stage 8b through a corresponding capacitor C22b.

Circuit stage 9b which provides selective control over amplification of low frequencies, preferably from DC to about 4 KHz, comprises a low frequency gain control potentiometer R24 having one end connected through a capacitor 23 to wiper 6 of gain control potentiometer R6 and the other end coupled to the circuit ground through a capacitor C24 of larger capacitance. A wiper 13 is selectively positionable to provide control over the low frequency gain, which may be preferably up to about 18 db.

For this purpose, a capacitor C25 couples the signal divided by wiper 13 to the noninverting input of operational amplifier A2b. The output of the latter provides the amplified low frequency signals through capacitor C22b to lead 15, which is interconnected with a compressor stage 16 through a pre-emphasis network.

The pre-emphasis network includes a capacitor C27 connected in series with a parallel-connected resistor R26 and further capacitor C28 having a common node 16 which is biased to ground through a resistor R27. The compressor includes a differential operational amplifier A3 having its inverting input interconnected with node 16 through a resistor R29. The noninverting input is provided with a DC reference voltage $V_{ref}$ through a resistor R30.

Although functioning overall in a signal compression function, compressor stage 16 in effect includes a gain cell 17 connected in series with a capacitor C29 and resistor R31 between the output of operational amplifier A3 and its inverting input, said gain cell thus providing a feedback loop having variable gain for amplifying the output signal of the operational amplifier as a function of the magnitude of a control signal provided to the gain cell by a lead 19 from a full wave rectifier 20.

Rectifier 20 is connected in series with a capacitor C31 and resistor R32 between the output and inverting input of the operational amplifier to provide full wave rectification of the input current. The rectified current is then averaged on a filter capacitor C32. The averaged value of the rectified input current results in a signal via lead 19 to gain cell 17.

The latter is simply an integrated circuit-realized or discrete transistor current in, current out device with the ratio $I_{out}/I_{in}$ controlled by rectifier 20 where change in gain in response to step changes in amplitude is given by $$G(t) = (G_{initial} - G_{final})3^{-t/T} + G_{final}T + 10^3(C32)$$

and where an output current $I_{out}$ provided to an internal summing node 21 is given by $$I_{out} = (V_{in} - V_{ref})/(R32)$$

Equivalently the gain cell functions as an expander, but since it provides negative feedback to operational amplifier A3, compression is realized. For example, if the input rises 6 db., the compressor stage output can rise only 3 db. The 3 db. increase in output level produces a 3 db. increase in gain in gain cell 17, yielding a 6 db. increase in feedback current to summing node 21. The overall gain of compressor stage 16 can be expressed as:

$$G_{comp} = \frac{(R32)(R31) I_b^{\frac{1}{2}}}{2(R_{in})(\overline{V}_{in})} = \frac{K I_b^{\frac{1}{2}}}{\overline{V}_{in}}$$

where K is simply a gain constant and where $R_{in}$ is the effective input resistance of the input as viewed from the noninverting input (approximately R29) and $I_b$ is the rectifier internal bias current and $\overline{V}_{in}$ is the average input voltage.

Frequency compensated control of the gain of operational amplifier A3 is provided by a DC feedback circuit comprising resistors R34, R35 and a capacitor C34. Such is necessary because there is no DC feedback path through gain cell 17. The operational amplifier will bias up to $$V_{out(DC)} = \left[ 1 + \frac{2(R34)}{(R27)} \right] V_{ref}$$

For the largest dynamic range, it is preferred that the compressor output be as large as possible whereby the rectifier input is maximized taken into consideration peak current restrictions. If the input signal is small, a large output can be produced by reducing the value of $R_{in}$ (being approximately resistor R29) with attendant decrease in input impedance, or by increasing the values of resistors R31 or R32, through preferably the value of resistor R31 is that which is increased so that the rectifier input current is not reduced.

Gain cell 17 is preferably temperature compensated and cancels odd-order harmonic distortion with even-order harmonic distortion being permitted only to the extent that internal offset voltages are present.

The output of compressor stage 16 is provided by a lead 23 to a compression indicator stage 24 via a diode D1. This stage includes a light emitting diode (LED) indicator lamp 25 suitably mounted within by the user. The LED is adapted to be driven by circuitry including NPN transistors Q1 and Q2. Transistor Q2 is driven by the unipolar signal provided by diode D1 through a resistor D33a and its base is biased to ground through a resistor R33b. The collector is provided with supply potential $V_{cc}$ through a current limiting resistor R36, while a similar resistor R37 provides the supply voltage to the collector of transistor Q1, the base of the latter being connected through a resistor R38 to the collector of transistor Q2. Coupling is provided between the collector of transistor Q1 and base of transistor Q2 is provided by a series connected capacitor C37 and resistor R39. Thus, the indicator stage provides a two-transistor switching circuit wherein LED 25 is not switched on except where sufficient base drive is provided to transistor Q2 from the compression stage.

Compression stage 16 is preferably configured to obtain a maximum usable compression to 120 db. at zero db. input. Accordingly, the LED indicator stage is preferably configured so that LED 25 is turned on at zero db. input corresponding to 120 db. compression. If insufficient input signal is received for driving the compressor to 120 db., the LED will remain unlit but the compressor will nevertheless remain operative. The actual amount of compression available is directly proportional to the level of the input signal and the amount of active frequency gain given by the active frequency control stages (as determined by the wiper positions of potentiometers R9 and R24 and overall gain potentiometer R6 which the user has selected to suit his application).

The output of compressor stage 16 is provided through a capacitor C38 to an attenuator stage 26 and applied across a load resistor R41. Connected across the latter is a voltage divider comprising resistors R42 and R43. A further resistor R44 connects the node between R42 and R43 to the output 2, with values chosen preferably to provide a 50 kiloohm output impedance, and that attenuation of the output signal will be sufficient to attenuate the compressor output so that the overall circuitry does not provide any gain (i.e., within about ±1 db. typically) of the signal provided at input 1.

Harmonic modification occurs between the active frequency control stages and the output of the compressor 16. The amount of harmonic modification is directly proportional to the amount of selective gain introduced by controls R9 and R24. To define harmonics, it can be said that any audio waveform that deviates from a true sine wave can be said to be constructed of harmonics. As this system will be processing complex, compounded audio waveforms, e.g., speech, music, etc., it can be noted that any signal being processed will be constructed of the aforementioned audio harmonics.

The output may be interconnected with the input of a conventional audio frequency amplifier such as utilized for public address, music reproduction, or the like.

Figure 2:
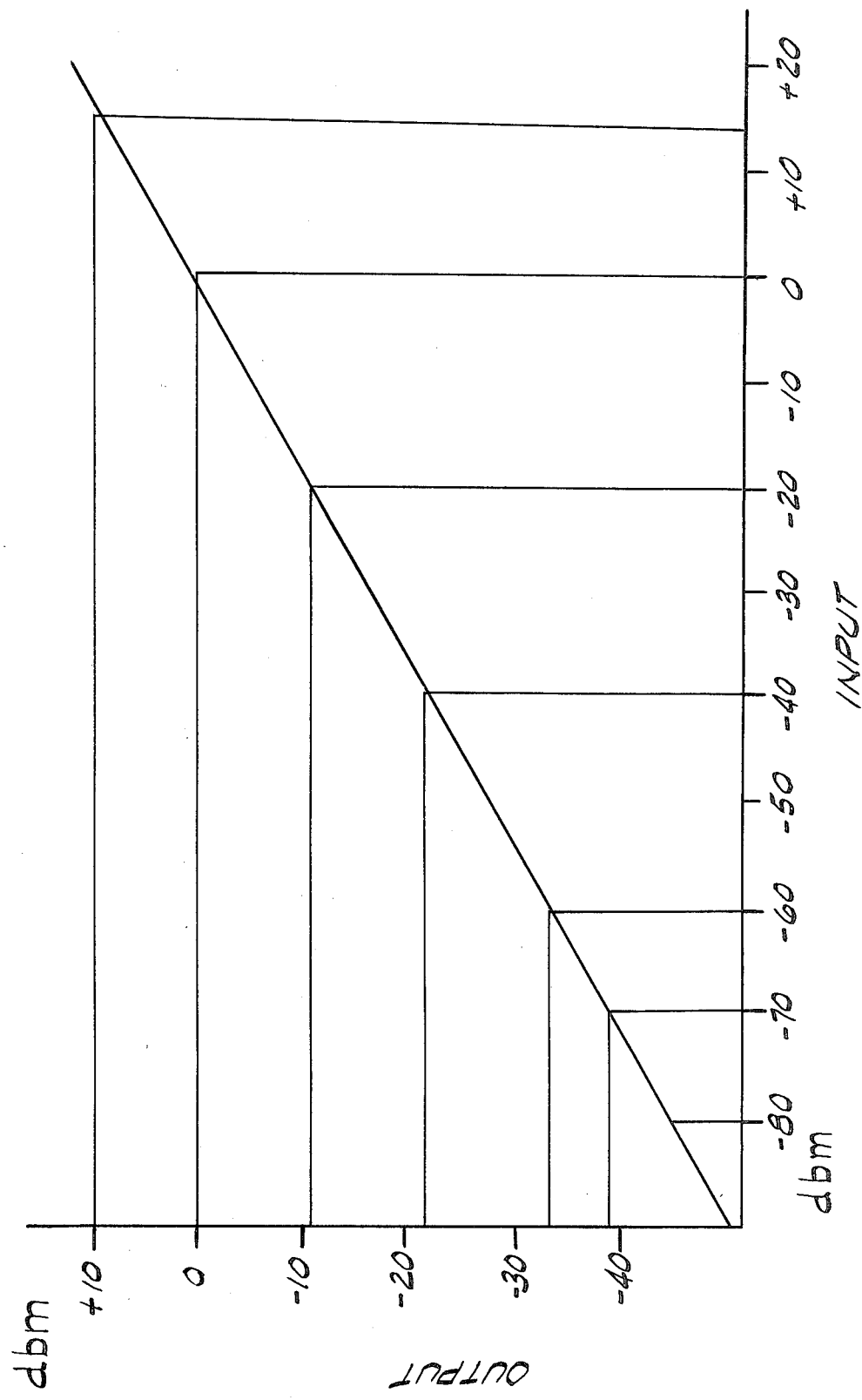
FIG. 2 is a graph portraying the basic input-output transfer curve of a compressor stage of the circuitry of FIG. 1.

Referring to FIG. 2, there is illustrated the preferred basic input-output transfer characteristic provided by compressor stage 16, whereby compressor input is signified the input signal provided by the active frequency control stages 8a, 9a and 8b, 9b. Preferably, circuitry of the invention is intended to accept any input signal from about 2 millivolts to about 775 millivolts, wherein the latter represents zero db.

A practical embodiment of the invention is exemplarity constructed of commercially available integrated circuit components to achieve compactness and ease of assembly for large sclae production. Thus, operational amplifiers of the invention may be of the differential type commercially available from Fiarchild Semiconductor Company having type designation UA 739, whereas a low cost dual gain compressor expander type of integrated circuit having type designation NE 570 may be utilized for the purpose of realizing compressor stage 16, with transistors Q1 and Q2 being commercial type 2N3904.

In operation, it is important to observe that the new active tone network of the invention is not intended to provide overall gain of the input signal which is provided to the circuit at input 1, processed, and then provided at output 2 but rather to improve tonal quality by achieving selectively greater strength and clarity of audio signals in different frequency bands, the gain of each of which bands is selectable by the user through provision of potentiometer R8 and R24. While two bands are thus controlled, it is well within the scope of the invention to provide control over additional bands defined by overlapping frequencies.

Optimum compression (preferably and typically 120 db.) is indicated by illumination of LED 25 and, for this purpose, the user may control the overall gain of the input signal by using potentiometer R6, and by selectively utilizing potentiometers R8 and R24 to emphasize the active frequency bands of choice.

Hence, the user may establish the degree of compression desired ranging from a maximum of 120 db. to a much smaller amount, dependent upon the setting of the individual gain controls. But whereas the signal provided to input 1 may have extremely wide dynamic range from −90 db. to about 15 db. (See FIG. 2). The output is effectively compressed into a relatively narrow dynamic range or "window" of about 50 db. The resultant signal has greater intelligibility and aptly may be referred to as having "punch".

When utilized with musical instruments, a musician using the circuit to process the electronically picked up sound from his instrument and to provide same to an amplifier system is greatly aided because the intelligibility of the music created is improved through reducing the dynamic extremes of the electronically detected signal which tend to obscure certain mistakes or to emphasize unwanted attributes of the musician's style, seemingly making the instrument easier to play or at least more intelligible to the musician. Sound variations not normally provided by a guitar can also be achieved.

When utilized to process voice or low-quality musical signals received by ratio, the new circuit greatly improves listenability, rendering the received signal vastly more clear and imparting to the same a "solid" character. Drops in signal intensity which often occur in short wave or from weak or remote signals have far less noticeability and are greatly limited in their effect by the invention.

A further illustration of advantageous utilization of the new circuit is in conjunction with home sound movie projection equipment which often typically provides a harsh, "hard" and seemingly distorted signal; but when the sound of such equipment is processed by the new circuit, immediate improvement is noted, and harshness gives way to clarity and absence of other objectionable attributes.

Further usage of great value may be such as an in-line accessory for use with certain telephone systems such as used in geographically remote areas and which may have antiquated equipment of poor tonal quality.

When utilized with inexpensive microphones typically having poor tonal response, the invention processes the microphone output in such a way that the microphone sounds as if it were of an expensive type having relatively high fidelity and full dynamic bandwidth. Additionally, the new device imparts versatility when used with a microphone as it permits the tonal characteristics of a voice picked to be selectively varied to produce best possible tonal structure from person to person.

When housed, as it may be, in a small enclosure, the new circuit provides a lightweight, compact device having only three controls for changing audio settings. Even when using small batteries, e.g., flashlight cells, for powering the circuitry, battery life substantially in excess of 100 hours of continuous operation is readily achievable.

Although the foregoing includes a description of the best mode contemplated for carrying out the invention, various modifications are contemplated.

As various modifications could be made in the constructions herein described and illustrated without departing from the scope of the invention, it is intended that all matter contained in the foregoing description or shown in the accompanying drawings shall be interpreted as illustrative rather than limiting.

What is claimed is:

1. A complete audio processing system for providing harmonic modification of any complex, compounded audio waveform of an audio signal, said system comprising an audio input for receiving an original audio signal from an external signal source, means for separating said audio signal into a plurality of different frequency bands, a plurality of channels, each separately gain-controllable, for receiving the respective frequency bands, gain control means in each channel for controlling the level of signals in the respective channel within each of the respective frequency bands associated with said channels thereby to control the amplitude of fundamental and harmonic audio signals within said bands, means for mixing output signals of said channels to provide a mixed audio signal, signal compressor means for dynamically compressing said mixed audio signal to provide a dynamically compressed tonally controlled audio signal, said signal compressor means providing dynamic compression of an input signal summed therein at a summing node and having a signal gain $G_{comp}$ expressed by the function $$G_{comp}=(KI_b^{\frac{1}{2}}/\overline{V}_{in})$$

where $I_b$ is the current flowing into said summing node, $\overline{V}_{in}$ is the average input voltage to said compressor means, and K is a gain constant, and an output for connection of external audio equipment to receive said dynamically compressed, tonally controlled audio output signal.

2. A complete audio processing system for providing harmonic modification of audio signals comprising an audio input for receiving an original audio signal from an external signal source, means for separating said audio signal into a plurality of different frequency bands, a plurality of gain-controllable channels for receiving the respective frequency bands, means in each channel for controlling the gain within each of the respective frequency bands associated with said channels thereby to control the amplitude of fundamental and harmonic audio signals within said bands, means for mixing output signals of said channels to provide a mixed audio signal, signal compressor means for dynamically compressing said mixed audio signal to provide a dynamically compressed tonally controlled audio signal, said signal compressor means comprising an amplifier and a feedback circuit interconnected between the output of said amplifier and the input thereof for providing nonlinearly increasing negative feedback signal to the input of said amplifier in response to increase in the level of said mixed audio signal, and an output for connection of external audio equipment to receive said dynamically compressed, tonally controlled audio output signal.

3. A complete audio processing system according to claim 2 and further comprising means for filtering said original audio signal to provide suppression of transients therein.

4. A complete audio processing system according to claim 3, said means for filtering said original audio signal comprising an active filter stage including an operational amplifier, an impedance matching network interconnecting an input of said operational amplifier with said audio input, and a resistive-capacitive feedback circuit interconnecting the output and input of said operational amplifier.

5. A complete audio processing system according to claim 4, said amplifier of said signal compression means comprising a differential operational amplifier having inverting and noninverting inputs and a single output providing an output signal which is a function of the differences between signals provided to said inverting and noninverting inputs, said inverting input receiving said mixed audio signals, means for supplying a reference voltage to said noninverting input, a first feedback circuit providing a feedback path between said amplifier output and said inverting input including means for rectifying current in said feedback path, means for averaging said rectified current, a second feedback circuit interconnecting said amplifier output and said inverting input including a gain cell responsive to said rectifier means for increasing the gain of the signal present at said amplifier output to provide a gain-increased feedback signal to said inverting input which is a function of the average of said rectified current, and means for controlling the gain of said operational amplifier.

6. A complete audio processing system according to claim 5, said signal compressor means providing dynamic compression of an input signal summed therein at a summing node and having a signal gain $G_{comp}$ expressed by the function $$G_{comp} = (KI_b^{\frac{1}{2}}/\overline{V}_{in})$$

where $I_b$ is the current flowing into said summing node, $\overline{V}_{in}$ is the average input voltage to said compressor means, and K is a gain constant.

7. A complete audio processing system according to claim 5, said compressor means providing substantially 120 db. of dynamic compression.

8. A complete audio processing system according to claim 4 and further comprising means for indicating a maximum level of compression by said signal compressor means.

9. A complete audio processing system according to claim 8, said means for indicating a maximum level of compression comprising a switching circuit interconnected with the output of said amplifier, said switching circuit comprising at least one transistor switching device, an indicator lamp connected to said switching device, said switching device energizing said lamp in response to the output of said amplifier reaching a level representing said optimum level of compression.

10. A complete audio processing system according to claim 2 and further comprising attenuator means for attenuating the level of the output signal provided by said signal compressor means to reduce overall gain of said active tone network sufficiently to cause the average level of said output signal to be substantially the same of that of said original audio signal.

11. A complete audio processing system according to claim 2, said means for each channel for tonal control of signals comprising means in each channel for selectively amplifying frequencies of the respective frequency band, means for selectively controlling the gain of each amplifier means, and passive resistive-capacitive circuits providing tonally selective input networks for each of said amplifier means.

12. A complete audio processing system according to claim 11 and further comprising an active transient filtering circuit including an operational amplifier for filtering said original audio amplifier signal to provide a transient suppressed signal at the output of said operational amplifier, a gain control potentiometer interconnected with the output of said operational amplifier, said potentiometer constituting an overall gain control of said network, means for separating signals controlled by said potentiometer into respective frequency bands including said passive circuits, and potentiometer means interconnected with each of said passive circuits for controlling gain of signals in the frequency bands associated with the respective channels.

13. A simplified solid state complete audio processing system for providing harmonic modification of audio signals comprising an audio input for receiving a original audio signal from an external signal source, means for filtering said original audio signal to provide transient suppression filtering thereof, means for separating the transient filtered audio signal into a plurality of different frequency bands, a plurality of channels for receiving the respective frequency bands, amplifier means in each channel for amplifying frequencies of the respective band, means for selectively controlling the gain of each amplifier means for tonal control, means for mixing tonally controlled signals provided by said channels to provide a mixed audio signal, signal compressor means for dynamically compressing said mixed audio signal to provide a dynamically compressed audio signal, and attenuator means for attenuating the level of said compressed signal to provide a tonally controlled, dynamically compressed audio output signal, and an output for connection of external audio equipment to receive said dynamically compressed audio output signal, means interconnected with said signal compressor means for indicating an optimum level of compression thereof, said attenuator means providing signal attenuation of said compressed signal by a degree sufficient to cause the average level of said output audio signal to be substantially the same as that of said original audio signal.

14. A complete audio processing system according to claim 13 wherein said signal compressor means comprises a differential operational amplifier having inverting and noninverting inputs and a single output providing an output signal which is a function of the differences between signals provided to the last said inputs, said inverting input receiving said mixed audio signal, means for supplying a reference voltage to said noninverting input, a first feedback circuit path between said amplifier output and inverting input including rectification circuit for rectifying current in said feedback path, a capacitance interconnected with said rectification circuit for averaging the rectified current, a second feedback circuit interconnecting said amplifier output and said inverting input including a gain cell, interconnected with said rectification circuit, for increasing the gain of the signal at said amplifier output to provide a gain-increased feedback signal to said inverting input which is an exponential function of the average of said rectified current, and a DC feedback circuit interconnecting said amplifier output and inverting input and including resistance for controlling the gain of said operational amplifier.

15. A complete audio processing system according to claim 14 and further comprising a pre-emphasis network for receiving said mixed audio signal and for supplying said mixed audio signal with pre-emphasis to said inverting input.

* * * * *